United States Patent [19]

Mochizuki et al.

[11] Patent Number: 4,861,417

[45] Date of Patent: Aug. 29, 1989

[54] METHOD OF GROWING GROUP III-V COMPOUND SEMICONDUCTOR EPITAXIAL LAYER

[75] Inventors: Kouji Mochizuki, Isehara; Masashi Ozeki, Yokohama; Nobuyuki Ohtsuka, Atsugi, all of Japan

[73] Assignee: Fujitsu Limited, Kawasaki, Japan

[21] Appl. No.: 172,671

[22] Filed: Mar. 24, 1988

[30] Foreign Application Priority Data

Mar. 27, 1987 [JP] Japan .................................. 62-71747

[51] Int. Cl.$^4$ ............................................. C30B 25/14
[52] U.S. Cl. ...................................... 156/610; 156/611; 156/613; 156/614; 156/DIG. 61; 156/DIG. 81; 156/DIG. 94; 156/DIG. 103
[58] Field of Search ................ 156/610, 611, 613, 614, 156/DIG. 61, DIG. 81, DIG. 94, DIG. 103; 437/236

[56] References Cited

U.S. PATENT DOCUMENTS

| | | | |
|---|---|---|---|
| 3,751,310 | 8/1973 | Cho | 148/DIG. 65 |
| 4,088,515 | 5/1978 | Blakeslee et al. | 156/610 |
| 4,261,771 | 4/1981 | Dingle et al. | 156/610 |
| 4,389,973 | 6/1983 | Suntola et al. | 427/255.7 |
| 4,413,022 | 11/1983 | Suntola et al. | 427/255.7 |
| 4,575,462 | 3/1986 | Dobson et al. | 156/610 |
| 4,640,720 | 2/1987 | Fexon | 156/612 |

OTHER PUBLICATIONS

Chang et al., "Smooth and Coherent Layers of GaAs and AlAs Grown by M.B.E.", Applied Physics Letters, vol. 28, No. 1, Jan. 1976, pp. 39 to 41.

Bedair et al., "Atomic Layer Epitaxy of III-V Binary Compounds", Applied Physics Letters, vol. 47, (1), Jul. 1, 1985, pp. 51 to 53.

"Kinetic Processes in Atomic-Layer Epitaxy of GaAs and AlAs Using Pulsed Vapor-Phased Method", M. Ozeki et al; J. Vac. Sci. Techn. B 5(4), Jul./Aug. 1987, pp. 1184–1186.

*Primary Examiner*—John Doll
*Assistant Examiner*—Robert M. Kunemund
*Attorney, Agent, or Firm*—Armstrong, Nikaido, Marmelstein, Kubovcik & Murray

[57] ABSTRACT

A method of growing a group III–V compound semiconductor epitaxial layer on a substrate by use of atomic layer epitaxy grows an aluminum layer on one of {100}, (111)B, (1/1)B, ($\bar{1}1\bar{1}$)B, and (1$\bar{1}\bar{1}$)B planes of the substrate by supplying a quantity of aluminum amounting to at least two times a surface density in a group III–V compound semiconductor epitaxial layer or grows an aluminum layer on one of {110} planes of the substrate by supplying a quantity of aluminum amounting to at least three times the surface density in the group III–V compound semiconductor epitaxial layer, and grows a layer of a group V material on the aluminum layer by supplying a quantity of the group V material amounting to at least two or three times a surface density in the group III–V compound semiconductor epitaxial layer. The layer of the group V material and the aluminum layer constituting the group III–V compound semiconductor epitaxial layer.

30 Claims, 15 Drawing Sheets

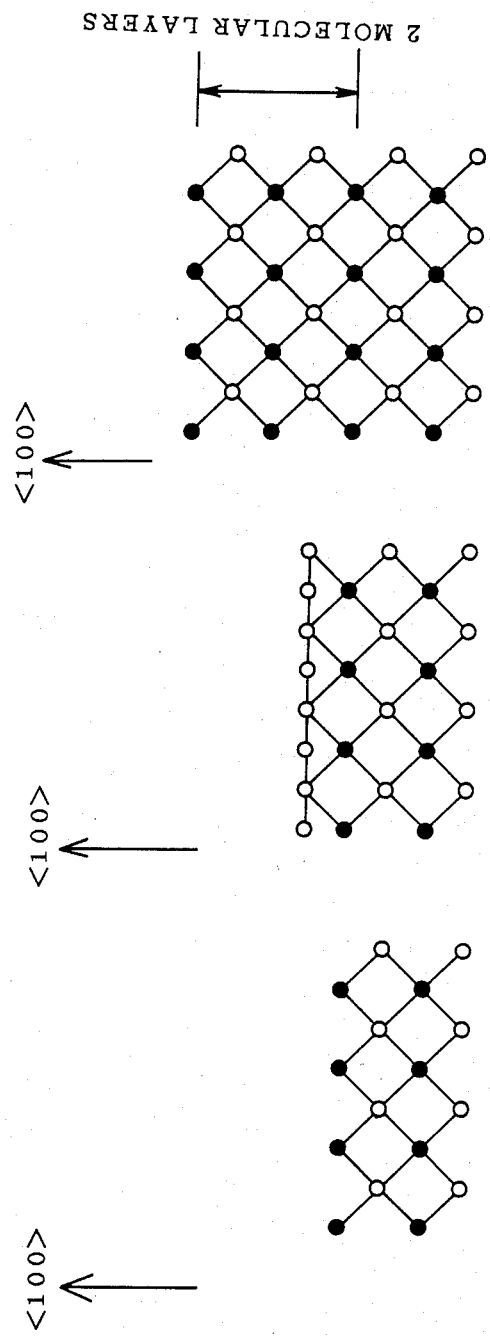

FIG. 10
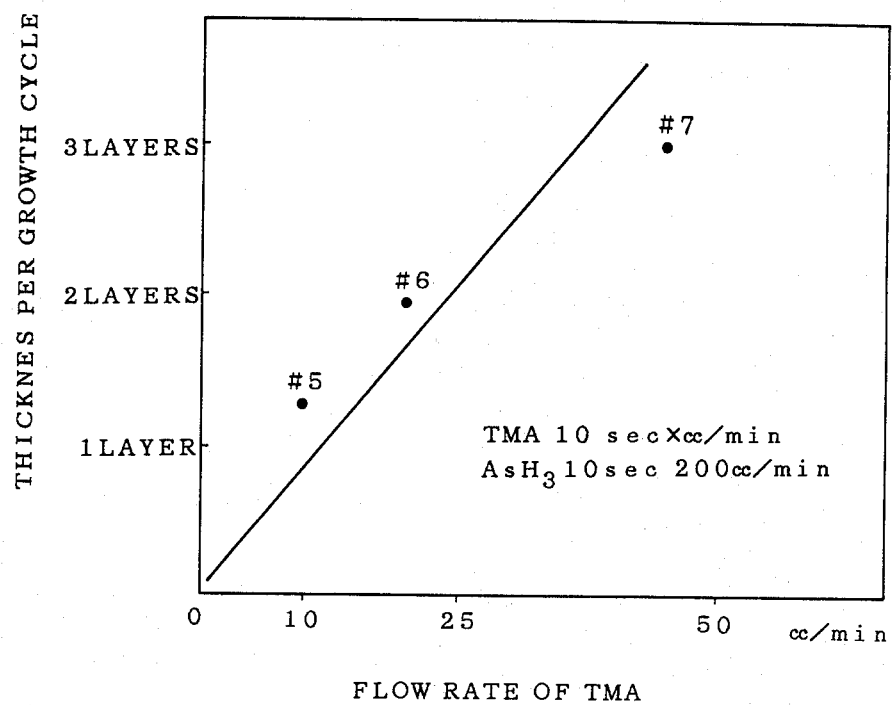
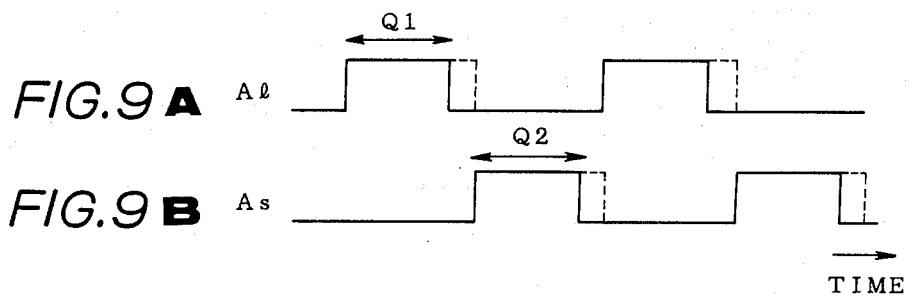

FIG. 11A  Introduction of As
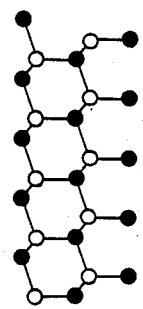
⟵ ⟨111⟩
FIG. 11B  Introduction of Aℓ
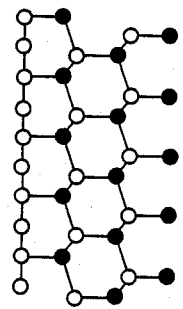
⟵ ⟨111⟩
FIG. 11C  Introduction of As
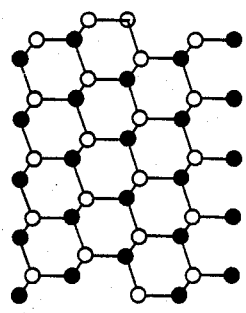
⟵ ⟨111⟩
|←— 2 MOLECULAR LAYERS —→|

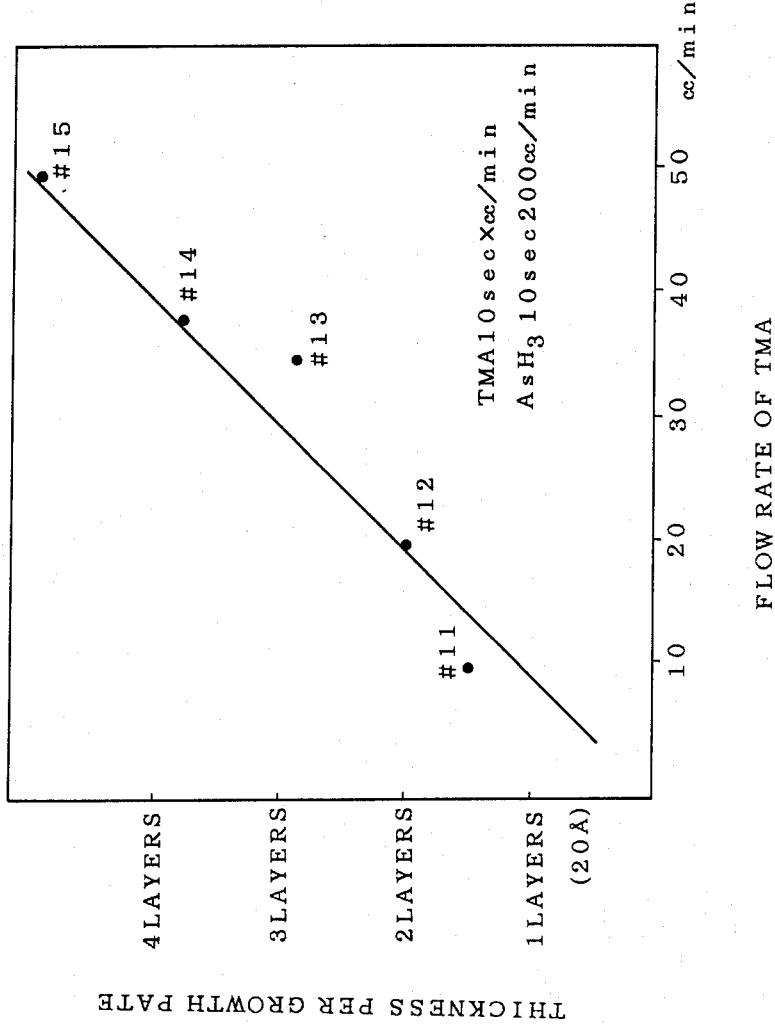

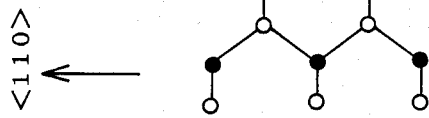
FIG.13C Introduction of As
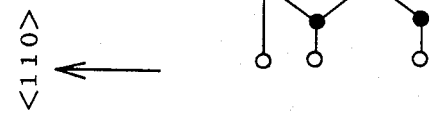
FIG.13B Introduction of Al
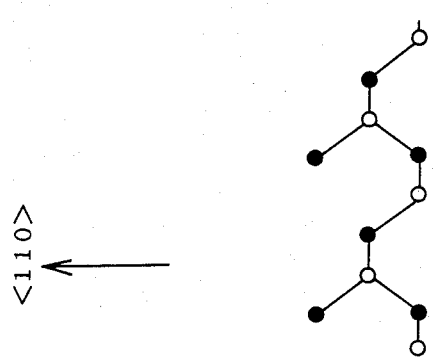
FIG.13A Introduction of As

2, 100μm

1

METHOD OF GROWING GROUP III-V COMPOUND SEMICONDUCTOR EPITAXIAL LAYER

BACKGROUND OF THE INVENTION

The present invention generally relates to methods of growing group III-V compound semiconductor epitaxial layers, and more particularly to a method of growing a group III-V compound semiconductor epitaxial layer by use of an atomic layer epitaxy.

Presently, the use of an atomic layer epitaxy (hereinafter simply referred to as an ALE) is becoming popular when growing a compound semiconductor epitaxial layer. The ALE is sometimes also referred to as a molecular layer epitaxy (MLE). For example, when growing a group III-V compound semiconductor epitaxial layer by use of the ALE, a compound including group V atoms and a compound including group III atoms are alternately supplied to a substrate, so as to grow epitaxial layers in atomic monolayers.

The following features are obtainable by the ALE. Firstly, the ALE is virtually unaffected by the growing conditions, that is, the results of the epitaxial growth virtually do not change even when the growing conditions are changed. Secondly, the thickness of the epitaxial layers can be controlled in atomic monolayers. Thirdly, it is possible to grow an epitaxial layer having a satisfactory surface morphology. Fourthly, it is possible to grow a uniform epitaxial layer.

The above described features are obtainable by the ALE for the following reasons. That is, the epitaxial growth is carried out completely in two dimensions because a deposition of a monolayer of first atoms (or molecules) is followed by a deposition of a monolayer of second atoms (or molecules). In addition, the supplied atoms (or molecules) have a self-limiting effect at the surface of the substrate. Due to the self-limiting effect, atoms (or molecules) amounting to only one atomic layer (or molecular layer) are deposited per operation cycle, and additional atoms (or molecules) will not be deposited on the grown layer even when excess atoms (or molecules) are supplied.

FIGS. 1A through 1E show models for explaining a growth of a gallium arsenide (GaAs) layer on a (100) plane (Miller index (100)) of the substrate. In FIGS. 1A through 1E, ⊕ denotes a gallium (Ga) atom and x denotes an arsenic (As) atom.

FIG. 1A shows a vicinity of the surface of a GaAs monocrystal substrate SUB. The substrate SUB is completed by forming the As last.

In order to grow a GaAs monocrystal layer on the substrate SUB by use of a metalorganic chemical vapor deposition (hereinafter simply referred to as an MOCVD), a quantity of Ga amounting to one layer in the GaAs monocrystal is supplied as shown in FIG. 1B. It will be assumed hereunder that the MOCVD is used for the epitaxial growth.

FIG. 1C shows a state where the supply of Ga is ended and one Ga layer is formed on the substrate SUB.

Next, as shown in FIG. 1D, As is supplied to grow one As layer on the Ga layer. Since As has the self-limiting effect, no excess As is deposited on the Ga layer. For this reason, there is no need to accurately control the supply quantity of As.

FIG. 1E shows a state where the supply of As is ended and one As layer is formed on the Ga layer. In FIG. 1E, L3 denotes one GaAs layer amounting to one molecular layer formed on the substrate SUB.

The processes of FIGS. 1B through 1E may be repeated when it is necessary to grow additional GaAs layers.

All of the features described before are obtained with the epitaxial layer which is grown by the ALE. However, even in the case of an epitaxial layer made of a material which does not have the self-limiting effect, it is possible to obtain the features obtainable by the ALE, except the first feature, by controlling the supply time of the material and controlling the growth rate per material supply cycle so as to grow the epitaxial layer in atomic monolayers.

As described heretofore, the ALE is an important technique of growing a compound semiconductor epitaxial layer. The present inventors have conducted various experiments related to the growth of group III-V compound semiconductor epitaxial layer by the ALE using trimethylaluminum (TMA: $(CH_3)_3Al$)/arsine ($AsH_3$) as the source material. From the experiments, it was found that aluminum (Al) which is in most cases an essential constituent element of the group III-V compound semiconductor epitaxial layer does not have the self-limiting effect for one atomic monolayer.

Al is an essential material constituting a compound semiconductor device, and for example, a superlattice made up of stacked AlAs layer and GaAs layer is often used. In this case, it is desirable that a transition at an interface between the AlAs layer and the GaAs layer occurs suddenly. For example, a superlattice has an AlAs layer amounting to three atomic monolayers and a GaAs layer amounting to three atomic monolayers which are stacked. Al is also used in a compound semiconductor device which requires a fine composition profile control, such as a high electron mobility transistor (HEMT), resonant-tunneling hot electron transistor (RHET) and multiquantum well (MQW) semiconductor laser.

Therefore, in order to grow a group III-V compound semiconductor epitaxial layer having Al as the group III element, it is desirable to use the ALE. However, as described before, Al does not have the self-limiting effect for one atomic monolayer. For this reason, the supply time of the material (Al) must be controlled to control the growth rate per material supply cycle so as to grow in atomic monolayers.

But even when the TMA/$AsH_3$ is used as the source material and the flow rate condition is set for the TMA so that an Al layer amounting to one molecular layer is grown in one material supply cycle, it was found from experiments that the Al epitaxial layer obtained does not have the features of the epitaxial layer grown by the ALE. Specifically, the surface morphology and uniformity of the Al epitaxial layer are poor.

SUMMARY OF THE INVENTION

Accordingly, it is a general object of the present invention to provide a novel and useful method of growing group III-V compound semiconductor epitaxial layer in which the problems described heretofore are eliminated.

Another and more specific object of the present invention is to provide a method of growing a group III-V compound semiconductor epitaxial layer on a substrate by use of atomic layer epitaxy comprising the steps of growing an aluminum layer on one of {100}, (111)B, ($\bar{1}11$)B, ($1\bar{1}1$)B, and ($11\bar{1}$)B planes of the substrate by supplying a quantity of aluminum amounting to at least two times a surface density of a layer which is in the group III-V compound semiconductor epitaxial layer and includes aluminum or growing an aluminum layer on one of {110}planes of the substrate by supplying a quantity of aluminum amounting to at least three times the surface density of a layer which is in the group III-V compound semiconductor epitaxial layer and includes aluminum, and growing a layer of a group V material on the aluminum layer by supplying a quantity of the group V material amounting to at least two or three times a surface density of a layer which is in the group III-V compound semiconductor epitaxial layer and includes the group V material. The layer of the group V material and the aluminum layer constitute the group III-V compound semiconductor epitaxial layer.

According to the method of the present invention, the surface morphology and uniformity of the group III-V compound semiconductor epitaxial layer having aluminum as the group III element are extremely satisfactory.

Other objects and further features of the present invention will be apparent from the following detailed description when read in conjunction with the accompanying drawings.

BRIEF DESCRIPTION OF THE DRAWINGS

FIGS. 8A, 8B and 8C show models for explaining the growth of an AlAs epitaxial layer on the (100) plane of a GaAs substrate at first, second and third steps of the embodiment, respectively;

FIGS. 9A and 9B show the supply of Al and As in the embodiment, respectively;

FIG. 10 shows a graph for explaining various conditions under which an AlAs epitaxial layer is grown on a (111) plane of a substrate by use of the ALE;

FIGS. 11A, 11B and 11C show models for explaining the growth of an AlAs epitaxial layer on the (111) plane of the GaAs substrate at the first, second and third steps of the embodiment, respectively;

FIG. 12 shows a graph for explaining various conditions under which an AlAs epitaxial layer is grown on a (110) plane of a substrate by use of the ALE;

FIGS. 13A, 13B and 13C show models for explaining the growth of an AlAs epitaxial layer on the (110) plane of the GaAs substrate at the first, second and third steps of the embodiment, respectively;

DETAILED DESCRIPTION

Figure 1A:
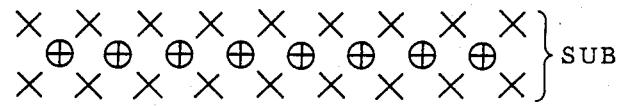
FIGS. 1A through 1E show models for explaining a growth of a GaAs layer on a (100) plane of a substrate.
Figure 1B:
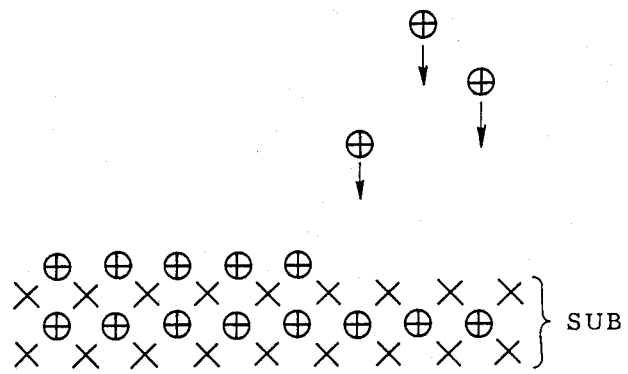
Figure 1C:
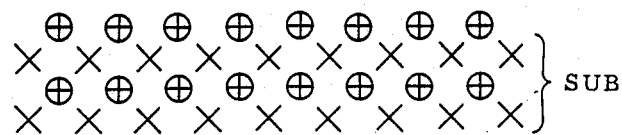
Figure 1D:
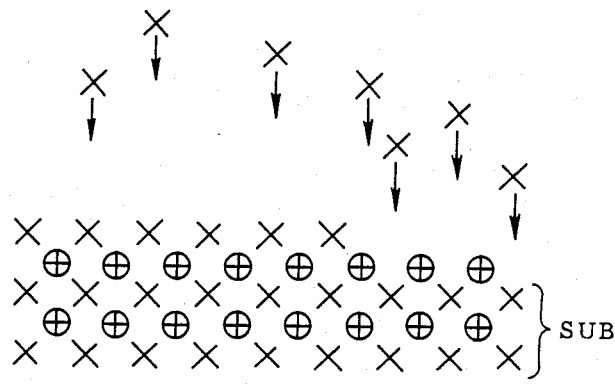
Figure 1E:
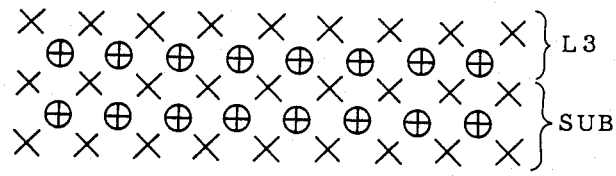
Figure 2:
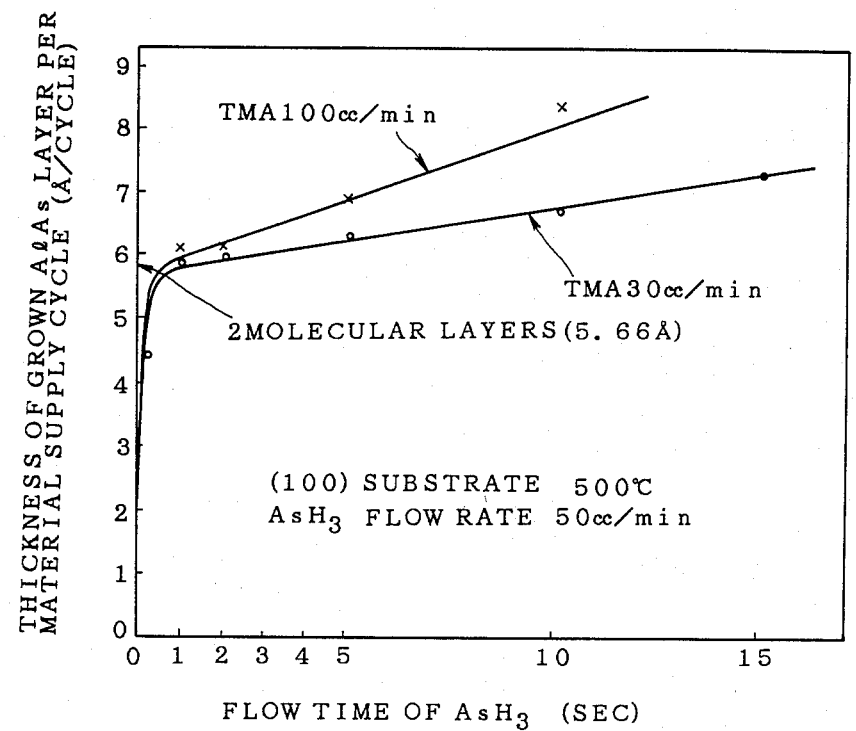
FIGS. 2, 3 and 4 respectively show flow time of AsH$_3$ versus thickness of grown layer per material supply cycle obtained as a result of first, second and third experiments.

The present inventors have conducted various experiments to grow a group III-V compound semiconductor epitaxial layer having Al as the group III element by use of the ALE, and an AlAs epitaxial layer was grown. FIG. 2 shows a growth rate of AlAs with respect to the supply quantity of AsH$_3$ in a first experiment. In FIG. 2, the ordinate indicates the thickness of the grown layer per material supply cycle and the abscissa indicates the flow time of AsH$_3$.

The epitaxial growth in the first experiment was carried out under the following conditions.

Experiment No. 1

Substrate material: GaAs
Plane of substrate: {100}
Substrate temperature: 500° C.
Flow rate of AsH$_3$: 50 cc/min
Parameter: Flow rate of TMA As the flow time (supplying quantity) of AsH$_3$ gradually increases, the thickness of the grown layer increases rapidly to two molecular layers per material supply cycle regardless of whether the flow rate of TMA is 30 cc/min or 100 cc/min, and the growth only gradually increases thereafter.

Figure 3:
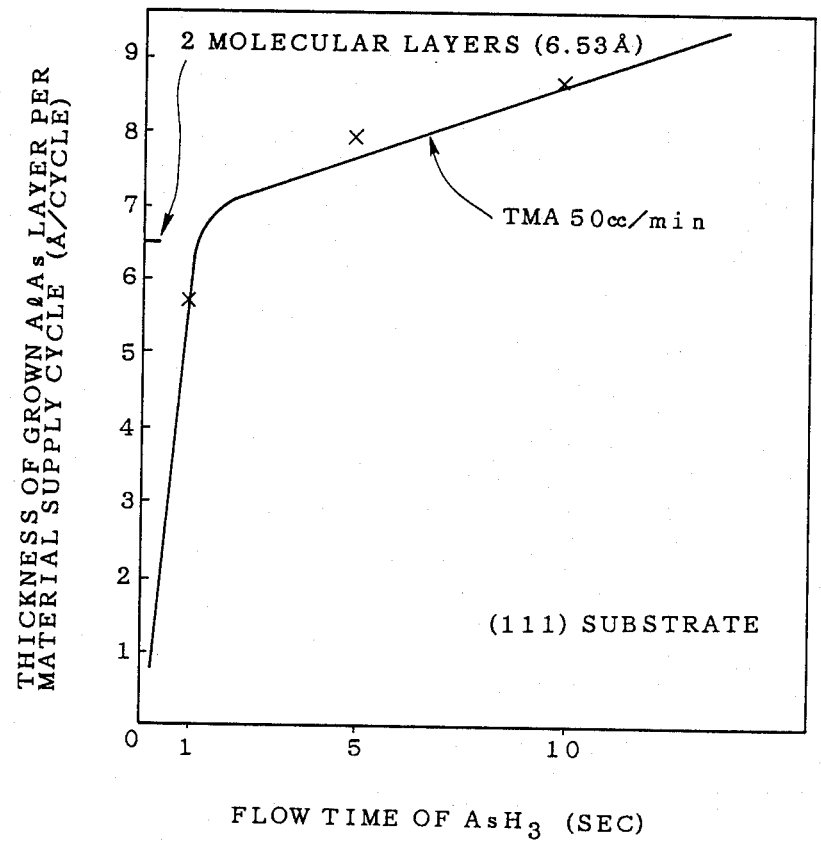

FIG. 3 shows a growth rate of AlAs with respect to the supply quantity of AsH$_3$ in a second experiment. In FIG. 3, the same designations are used as in FIG. 2.

The epitaxial growth in the second experiment was carried out under the following conditions.

Experiment No. 2

Substrate material: GaAs
Plane of substrate: (111)B, ($\bar{1}\bar{1}1$)B, ($\bar{1}1\bar{1}$)B, ($1\bar{1}\bar{1}$)B
Substrate temperature: 500° C.
Flow rate of AsH$_3$: 50 cc/min
Flow rate of TMA: 50 cc/min As in the case of the first experiment, the thickness of the grown layer increases rapidly to two molecular layers per material supply cycle and the growth only gradually increases thereafter.

Figure 4:
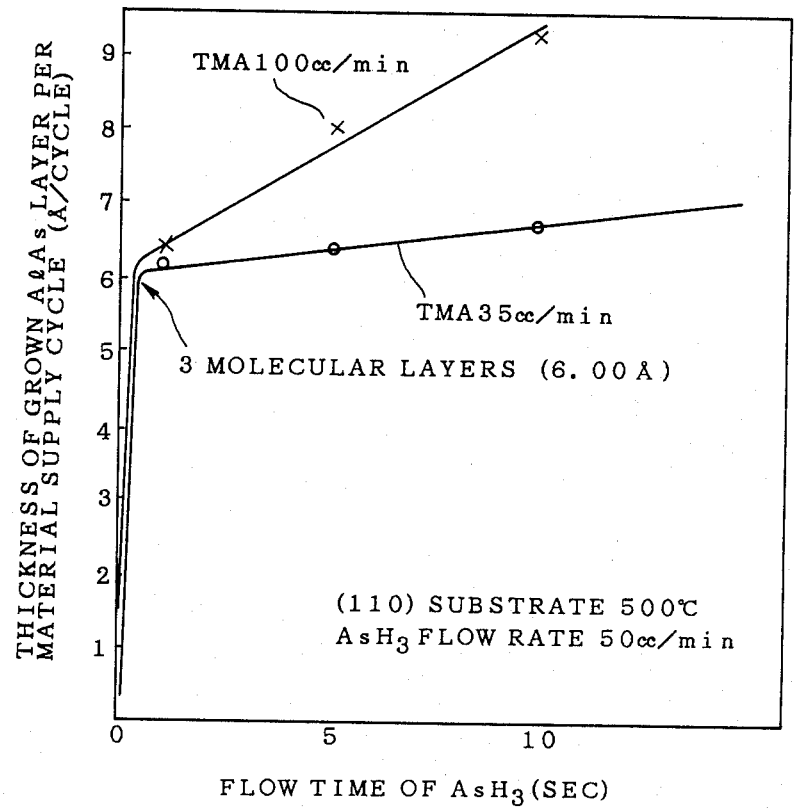

FIG. 4 shows a growth rate of AlAs with respect to the supply quantity of AsH$_3$ in a third experiment. In FIG. 3, the same designations are used as in FIGS. 2 and 3.

The epitaxial growth in the third experiment was carried out under the following conditions.

Experiment No. 3

Substrate material: GaAs
Plane of substrate: {110}
Substrate temperature: 500° C.
Flow rate of AsH$_3$: 50 cc/min
Parameter: Flow rate of TMA As the flow time (supplying quantity) of AsH$_3$ gradually increases, the thickness of the grown layer increases rapidly to three molecular layers per material supply cycle regardless of whether the flow rate of TMA is 35 cc/min or 100 cc/min, and the growth only gradually increases thereafter.

For the sake of convenience, the {100} planes will hereinafter be represented by the (100) plane, the (111)B, ($\bar{1}$11)B, ($\bar{1}\bar{1}$1)B, (1$\bar{1}\bar{1}$)B planes by the (111) plane, and the {110} planes by the (110) plane.

The first through third experiments were repeated a plurality of times, and it was confirmed that the same results are obtained each time. Hence, it was found that two molecular layers per material supply cycle is a special growth rate on the (100) or (111) plane of the substrate and that three molecular layers per material supply cycle is a special growth rate on the (110) plane of the substrate.

Experiments were conducted under the above described conditions to grow the group III-V compound semiconductor epitaxial layer having Al as the group III element. As a result, it was possible to grow an extremely satisfactory AlAs epitaxial layer which could not be obtained by the conventional ALE which deposits Al atoms amounting to one atomic monolayer on the substrate similarly as described before in conjunction with FIGS. 1A through 1E.

It was found from the experiments that on the (100) and (111) planes, Al is stable in a state where a quantity of Al two times the surface density of a layer which is in the group III-V compound semiconductor epitaxial layer and includes Al is deposited. It was also found from the experiments that on the (110) plane, Al is stable in a state where a quantity of Al three times the surface density of a layer which is in the group III-V compound semiconductor epitaxial layer and includes Al is deposited.

Accordingly, in the method of growing a group III-V compound semiconductor epitaxial layer according to the present invention where Al is used as the group III element, a quantity of Al at least two times the surface density of a layer which is in the group III-V compound semiconductor epitaxial layer and includes Al is grown by ALE on the (100) or (111) plane of the substrate, or a quantity of Al at least three times the surface density of a layer which is in the group III-V compound semiconductor epitaxial layer and includes Al is grown by ALE on the (110) plane of the substrate, and a layer made of another material of group V is grown on top of the Al epitaxial layer by ALE. According to the method of the present invention, the surface morphology and uniformity of the group III-V compound semiconductor epitaxial layer is extremely satisfactory even when Al is used as the group III element.

Figure 5:
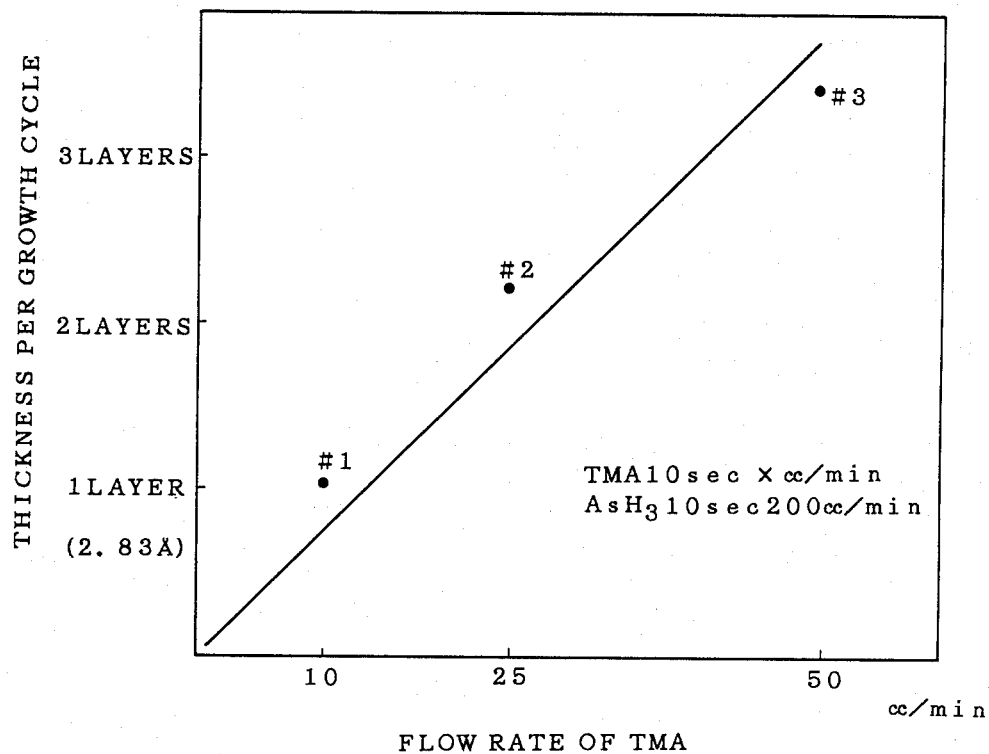
FIG. 5 shows a graph for explaining various conditions under which an AlAs epitaxial layer is grown on a (100) plane of a substrate by use of the ALE.

FIG. 5 shows a graph for explaining various conditions under which an AlAs epitaxial layer is grown on a (100) plane of a substrate by use of the ALE. The MOCVD is used for the epitaxial growth, and in FIG. 5, the ordinate indicates the thickness of the layer per growth cycle and the abscissa indicates the flow rate of TMA.

In FIG. 5, #1 denotes a datum obtained by the conventional method, #2 denotes a datum obtained by the method of the present invention, and #3 denotes a datum obtained under a certain condition. These data are obtained with the flow time of TMA set to 10 seconds in a unit cc/min, the flow time of AsH$_3$ set to 10 seconds at 200 cc/min, and the thickness of one layer set to 2.83 Å.

As may be seen from FIG. 5, the flow rate of TMA is 13 cc/min according to the conventional method, but the flow rate of TMA is 26 cc/min according to the present invention. Hence, it is possible to obtain a growth rate amounting to two molecular layers per material supply cycle, and the AlAs layer which is finally formed has an extremely fine quality.

Figure 6:
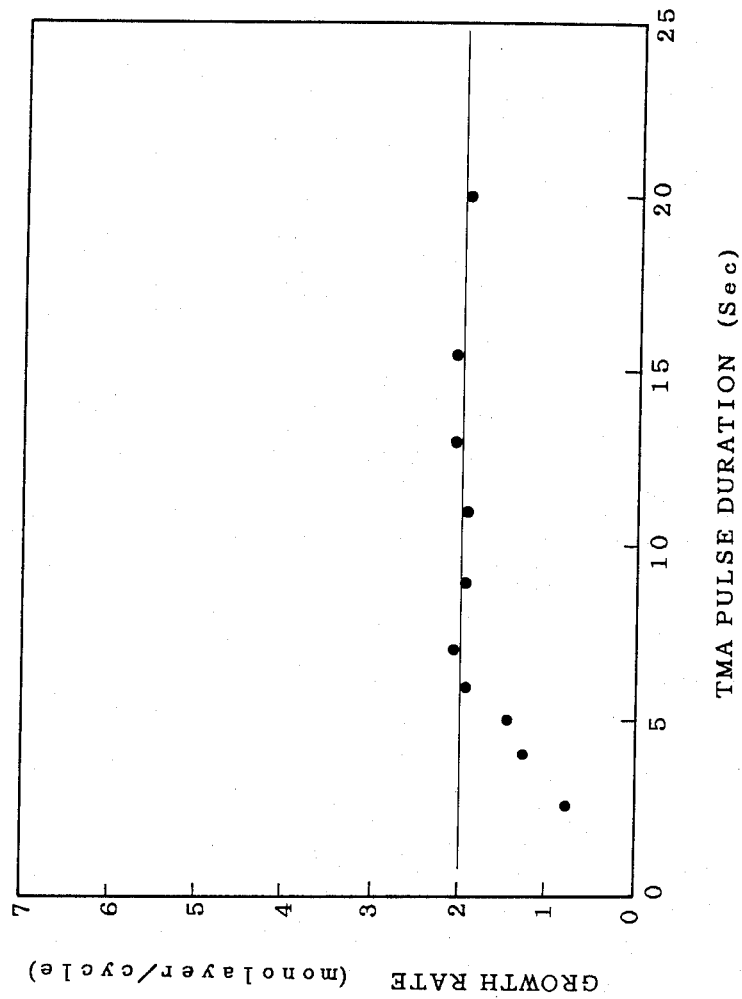
FIG. 6 shows a TMA pulse duration versus growth rate characteristic obtained when the certain condition of a datum #3 shown in FIG. 5 is corrected so that the ALE is correctly carried out.

FIG. 6 shows a TMA pulse duration versus growth rate characteristic obtained when the certain condition of the datum #3 is corrected so that the ALE is correctly carried out. The substrate temperature is 500° C., the flow rate of AsH$_3$ is 480 cc/min, and the flow rate of TMA is 100 cc/min. It may be seen from FIG. 6 that the deposition of Al on the (100) plane of the substrate substantially stops when Al atoms amounting to two molecular layers are deposited on the substrate.

Figure 7:
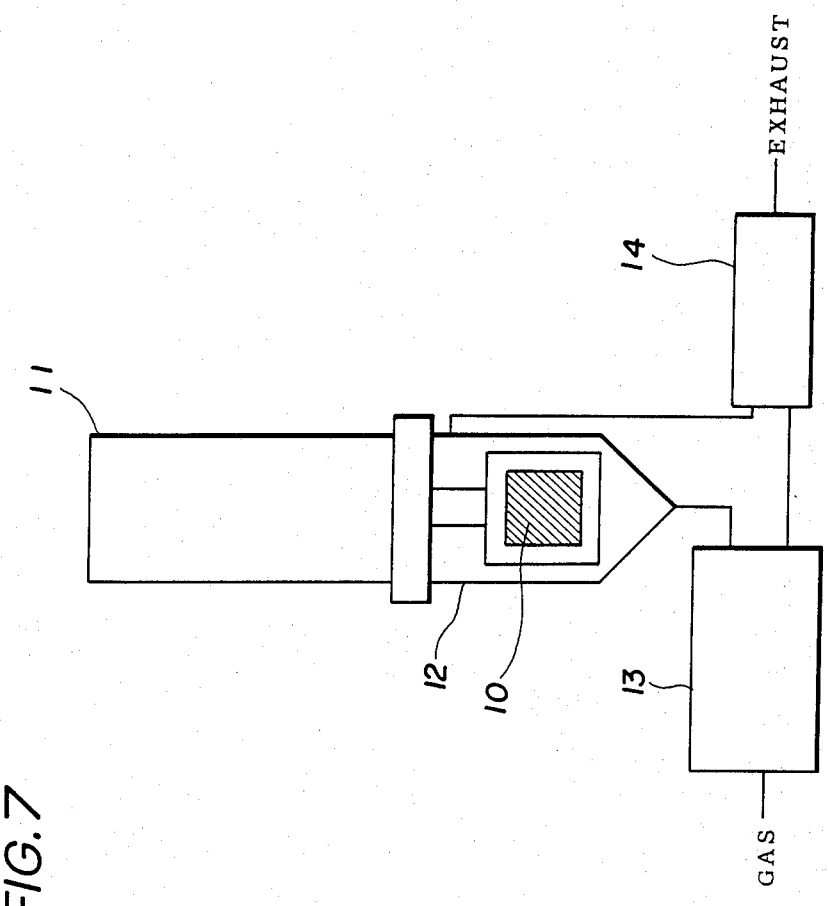
FIG. 7 generally shows an apparatus which is used to carry out processes of an embodiment of the method according to the present invention.

Next, a description will be given on an embodiment of the present invention when growing AlAs on the (100) plane of a GaAs substrate. FIG. 7 shows an apparatus which is used in the present embodiment. In a first step, a GaAs substrate 10 from a preparation chamber 11 is transported into a reaction chamber 12, and As is supplied to the surface of the GaAs substrate 10 in the reaction chamber 12 from a gas system 13. In a second step, H$_2$ is supplied to the reaction chamber 12 from the gas system 13, and after exhausting As in the reaction chamber 12 through a pump 14, a quantity of TMA at least amounting to two times the surface density in the group III-V compound semiconductor crystal is supplied to the reaction chamber 12 from the gas system 13 so as to deposit Al on the surface of the GaAs substrate 10. In a third step, Hhd 2 1 is supplied to the reaction chamber 12 from the gas system 13, the remaining TMA in the reaction chamber 12 is exhausted through the pump 14, and an appropriate quantity of AsH$_3$ is supplied to the reaction chamber 12 from the gas system 13. The second and third steps may be repeated according to the needs.

FIGS. 8A, 8B and 8C show models for explaining the growth of the AlAs epitaxial layer on the (100) plane of the GaAs substrate 10 at the first step, the second step and the third step, respectively. In FIGS. 8A through 8C, white circular marks denote Al atoms and black circular marks denote As atoms.

FIGS. 9A and 9B show the supply of Al and As in the present embodiment, respectively. Since the growth of Al substantially stops when Al atoms amounting to two times the surface density in the AlAs layer, that is, two molecular layers, are deposited on the GaAs substrate 10, a quantity Ql of Al which is supplied may be equal to Al atoms amounting to two molecular layers as indicated by a solid line in FIG. 9A or greater than Al atoms amounting to two molecular layers as indicated by phantom lines in FIG. 9A. In other words, the quantity Ql must be equal to at least Al atoms amounting to two molecular layers. On the other hand, As has the self-limiting effect. For this reason, a quantity Q2 of As which is supplied may be equal to As atoms amounting to two times the surface density in the AlAs layer, that is, two molecular layers, as indicated by a solid line in FIG. 9B or greater than As atoms amounting to two molecular layers as indicated by phantom lines in FIG. 9B. In other words, the quantity Q2 must be equal to al least As atoms amounting to two molecular layers.

FIG. 10 shows a graph for explaining various conditions under which an AlAs epitaxial layer is grown on a (111) plane of a substrate by use of the ALE. The MOCVD is used for the epitaxial growth, and in FIG. 10, the same designations are used as in FIG. 5.

In FIG. 10, #5 denotes a datum obtained by the conventional method, #6 denotes a datum obtained by the method of the present invention, and #7 denotes a datum obtained under a certain condition. These data are obtained with the flow time of TMA set to 10 seconds in a unit cc/min, the flow time of AsH$_3$ set to 10 seconds at 200 cc/min, and the thickness of one layer set to 2.83 Å.

As may be seen from FIG. 10, the flow rate of TMA is 10 cc/min according to the conventional method, but the flow rate of TMA is 20 cc/min according to the present invention. Hence, it is possible to obtain a growth rate amounting to two molecular layers per material supply cycle, and the AlAs layer which is finally formed has an extremely fine quality.

A TMA pulse duration versus growth rate characteristic obtained when the certain condition of the datum #7 is corrected so that the ALE is correctly carried out becomes similar to that shown in FIG. 6. In other words, the deposition of Al on the (111) plane of the substrate substantially stops when Al atoms amounting to two molecular layers are deposited on the substrate.

FIGS. 11A, 11B and 11C show models for explaining the growth of the AlAs epitaxial layer on the (111) plane of the GaAs substrate 10 at the first step, the second step and the third step, respectively. In FIGS. 11A through 11C, the same designations are used as in FIGS. 8A through 8C.

FIG. 12 shows a graph for explaining various conditions under which an AlAs epitaxial layer is grown on a (110) plane of a substrate by use of the ALE. The MOCVD is used for the epitaxial growth, and in FIG. 12, the same designations are used as in FIG. 5.

In FIG. 12, #11 denotes a datum obtained by the conventional method, #13 denotes a datum obtained by the method of the present invention, and #12, #14 and #15 denote data obtained under a certain condition. These data are obtained with the flow time of TMA set to 10 seconds in a unit cc/min, the flow time of AsH$_3$ set to 10 seconds at 200 cc/min, and the thickness of one layer set to 2.83 Å.

As may be seen from FIG. 12, the flow rate of TMA is 10 cc/min according to the conventional method, but the flow rate of TMA is 30 cc/min according to the present invention. Hence, it is possible to obtain a growth rate amounting to three molecular layers per material supply cycle, and the AlAs layer which is finally formed has an extremely fine quality.

A TMA pulse duration versus growth rate characteristic obtained when the certain condition of the data #12, #14 and #15 is corrected so that the ALE is correctly carried out becomes similar to that shown in FIG. 6 except that the growth of Al substantially stops when Al atoms amounting to three molecular layers are deposited on the substrate.

FIGS. 13A, 13B and 13C show models for explaining the growth of the AlAs epitaxial layer on the (110) plane of the GaAs substrate 10 at the first step, the second step and the third step, respectively. In FIGS. 13A through 13C, the same designations are used as in FIGS. 8A through 8C.

Since the growth of Al substantially stops when Al atoms amounting to three times the surface density in the AlAs layer, that is, three molecular layers, are deposited on the GaAs substrate 10, a quantity Q1 of Al which is supplied may be equal to Al atoms amounting to three molecular layers as indicated by a solid line in FIG. 9A or greater than Al atoms amounting to three molecular layers as indicated by phantom lines in FIG. 9A. In other words, the quantity Q1 must be equal to at least Al atoms amounting to three molecular layers. On the other hand, As has the self-limiting effect. For this reason, a quantity Q2 of As which is supplied may be equal to As atoms amounting to three times the surface density of the AlAs layer, that is, three molecular layers, as indicated by a solid line in FIG. 9B or greater than As atoms amounting to three molecular layers as indicated by phantom lines in FIG. 9B. In other words, the quantity Q2 must be equal to al least As atoms amounting to three molecular layers.

Figure 14:
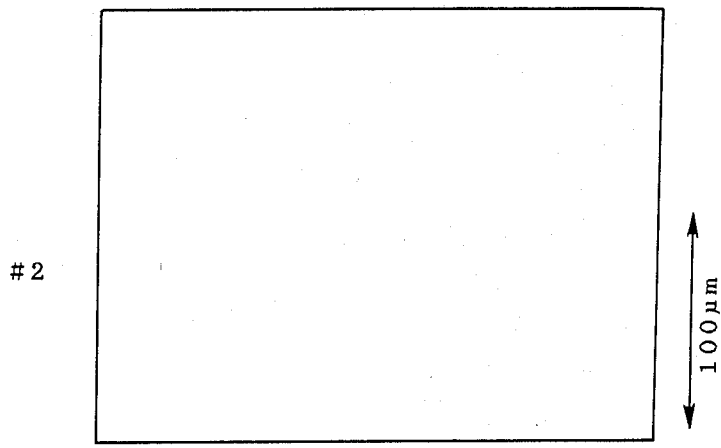
FIG. 14 shows a microphotograph of a wafer surface grown with an AlAs layer on the (100) plane by the method of the present invention.
Figure 15:
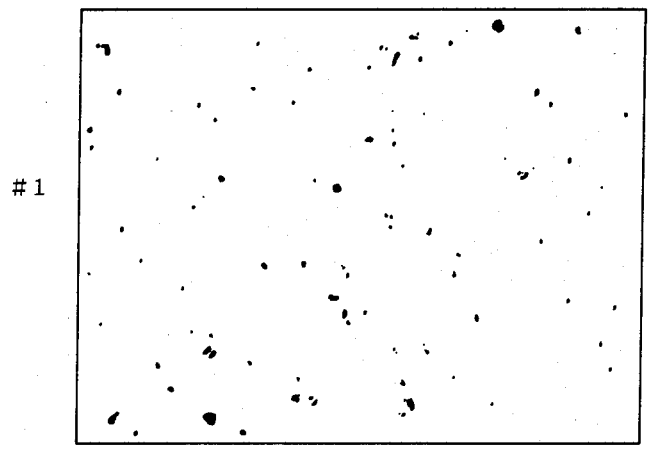
FIGS. 15 and 16 show microphotographs of a wafer surface grown with an AlAs layer on the (100) plane with the flow rate of TMA set to 10 cc/min and 50 cc/min, respectively, so that the growth rate of Al amounts to one atomic layer per material supply cycle and 3.5 atomic layers per material supply cycle and respectively correspond to the data #1 and #3 shown in FIG. 5.
Figure 16:
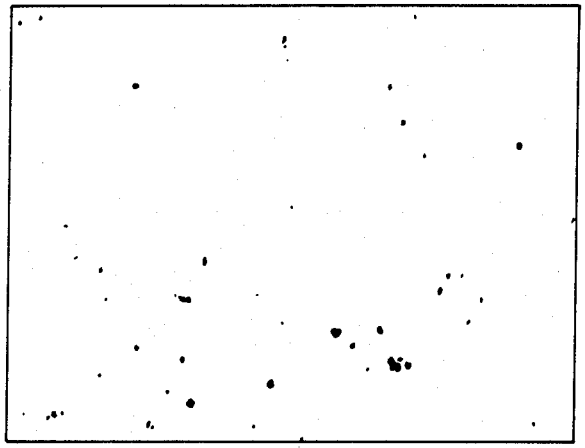

FIG. 14 shows a microphotograph of a wafer surface grown with an AlAs epitaxial layer on the (100) plane by the method of the present invention. The result shown in FIG. 14 was obtained with the flow rate of TMA set to 25 cc/min so that the growth rate of Al amounts to two molecular layers per material supply cycle, and corresponds to the datum #2 shown in FIG. 5. FIGS. 15 and 16 show microphotographs of a wafer surface grown with an AlAs layer on the (100) plane with the flow rate of TMA set to 10 cc/min and 50 cc/min, respectively, so that the growth rate of Al amounts to one atomic layer per material supply cycle and 3.5 atomic layers per material supply cycle and respectively correspond to the data #1 and #3 shown in FIG. 5.

It may be seen by comparing FIGS. 14 through 16 that the wafer surface of FIG. 14 is far superior in quality compared to those shown in FIGS. 15 and 16.

TMA is used in the described embodiment, however, it is possible to use triethylaluminum (TEA: (C$_2$H$_5$)$_3$Al) instead. In addition, the present invention may be applied to the epitaxial growth of other group III-V compound semiconductor epitaxial layers having Al as the group III element, such as aluminum phosphorus (AlP) and aluminum antimonide (AlSb). Moreover, the epitaxial growth of the layers is not limited to the use of MOCVD, but it is possible to use other methods such as molecular beam epitaxy (MBE).

Further, the present invention is not limited to these embodiments, but various variations and modifications may be made without departing from the scope of the present invention.

What is claimed is:

1. A method of growing a group III-V compound semiconductor epitaxial layer on a substrate by use of atomic layer epitaxy, said method comprising the steps of:

growing an aluminum layer on one of the {100 }, (111)B, ($\bar{1}$11)B, (1$\bar{1}$1)B, and (11$\bar{1}$)B planes of the substrate by supplying a quantity of aluminum amounting to at least two times the surface density of aluminum in a molecular layer of said group III-V compound semiconductor epitaxial layer, wherein the obtained aluminum layer contains a quantity of aluminum essentially equal to at least the total quantity of aluminum in two molecular layers of said group III-V compound semiconductor epitaxial layer; and growing a layer of a group V material on the aluminum layer by supplying a quantity of the group V material amounting to at least two times the surface density of said group V material in a molecular layer of said group III-V compound semiconductor epitaxial layer, said layer of the group V material and said aluminum layer constituting said group III-V compound semiconductor epitaxial layer.

2. A method of growing a group III-V compound semiconductor epitaxial layer on a substrate by use of atomic layer epitaxy as claimed in claim 1 in which said group V material is selected from a group of arsenic (As), phosphorus (P) and antimony (Sb).

3. A method of growing a group III-V compound semiconductor epitaxial layer on a substrate by use of atomic layer epitaxy as claimed in claim 1 in which said steps of growing the aluminum layer and the layer of the group V material use either one of metalorganic chemical vapor deposition and molecular beam epitaxy.

4. A method of growing a group III-V compound semiconductor epitaxial layer on a substrate by use of atomic layer epitaxy as claimed in claim 1 in which said step of growing the aluminum layer and said step of growing the layer of the group V material are alternately carried out a plurality of times.

5. A method of growing a group III-V compound semiconductor epitaxial layer on a substrate by use of atomic layer epitaxy as claimed in claim 1 in which said step of growing the aluminum layer uses one of trimethylaluminum (TMA: $(CH_3)_3Al$) and triethylaluminum (TEA: $(C_2H_5)_3Al$) as a source material.

6. A method of growing a group III-V compound semiconductor epitaxial layer on a substrate by use of atomic layer epitaxy, said method comprising the steps of:
   growing an aluminum layer on one of the {110} planes of the substrate by supplying a quantity of aluminum amounting to at least three times the surface density of aluminum in a molecular layer of said group III-V compound semiconductor epitaxial layer, wherein the obtained aluminum layer contains a quantity of aluminum essentially equal to at least the total quantity of aluminum in three molecular layers of said group III-V compound semiconductor epitaxial layer; and
   growing a layer of a group V material on the aluminum layer by supplying a quantity of the group V material amounting to at least three times the surface density of said group V material in a molecular layer of said group III-V compound semiconductor epitaxial layer, said layer of the group V material and said aluminum layer constituting said group III-V compound semiconductor epitaxial layer.

7. A method of growing a group III-V compound semiconductor epitaxial layer on a substrate by use of atomic layer epitaxy as claimed in claim 6 in which said group V material is selected from a group of arsenic (As), phosphorus (P) and antimony (Sb).

8. A method of growing a group III-V compound semiconductor epitaxial layer on a substrate by use of atomic layer epitaxy as claimed in claim 6 in which said steps of growing the aluminum layer and the layer of the group V material use either one of metalorganic chemical vapor deposition and molecular beam epitaxy.

9. A method of growing a group III-V compound semiconductor epitaxial layer on a substrate by use of atomic layer epitaxy as claimed in claim 6 in which said step of growing the aluminum layer and said step of growing the layer of the group V material are alternately carried out a plurality of times.

10. A method of growing a group III-V compound semiconductor epitaxial layer on a substrate by use of atomic layer epitaxy as claimed in claim 6 in which said step of growing the aluminum layer uses one of trimethylaluminum (TMA: $(CH_3)_3Al$) and triethylaluminum (TEA: $(C_2H_5)_3Al$) as a source material.

11. A method of growing a group III-V compound semiconductor epitaxial layer on a substrate by use of atomic layer epitaxy, said method comprising the steps of:
   growing an aluminum layer on one of the {100}, (111)B, ($\bar{1}11$)B, ($1\bar{1}1$)B and ($11\bar{1}$)B planes of the substrate by supplying a quantity of aluminum amounting to at least two times the surface density of aluminum in a molecular layer of said group III-V compound semiconductor epitaxial layer, whereby the obtained aluminum layer contains a quantity of aluminum essentially equal to at least the total quantity of aluminum in two molecular layers of said group III-V compound semiconductor epitaxial layer; and
   growing a layer of group V material on the aluminum layer after said step of growing the aluminum layer by supplying a quantity of the group V material amounting to at least two times the surface density of said group V material in a molecular layer of said group III-V compound semiconductor epitaxial layer,
   said layer of the group V material and said aluminum layer constituting said group III-V compound semiconductor epitaxial layer, wherein said group III-V compound semiconductor layer has two molecular layers.

12. A method of growing a group III-V compound semiconductor epitaxial layer on a substrate by use of atomic layer epitaxy as claimed in claim 11, in which said group V material is selected from a group of arsenic (As), phosphorus (P) and antimony (Sb).

13. A method of growing a group III-V compound semiconductor epitaxial layer on a substrate by use of atomic layer epitaxy as claimed in claim 11, in which said steps of growing the aluminum layer and the layer of the group V material use either one of metalorganic chemical vapor deposition and molecular beam epitaxy.

14. A method of growing a group III-V compound semiconductor epitaxial layer on a substrate by use of atomic layer epitaxy as claimed in claim 11, in which said step of growing the aluminum layer and said step of growing the layer of the group V material are alternately carried out a plurality of times.

15. A method of growing a group III-V compound semiconductor epitaxial layer on a substrate by use of atomic layer epitaxy as claimed in claim 11, in which said step of growing the aluminum layer uses one of trimethylaluminum (TMA: $(CH_3)_3Al$) and triethylaluminum (TEA: $(C_2H_5)_3Al$) as a source material.

16. A method of growing a group III-V compound semiconductor epitaxial layer on a substrate by use of atomic layer epitaxy, said method comprising the steps of:
   growing a layer of a group V material on one of the {100}, (111)B, ($\bar{1}11$)B, ($1\bar{1}1$)B and ($11\bar{1}$)B planes of the substrate by supplying a quantity of the group V material amounting to at least two times the surface density of said group V material in a molecular layer of said group III-V compound semiconductor epitaxial layer; and
   growing an aluminum layer on the layer of the group V material after said step of growing the group V material by supplying a quantity of aluminum amounting to at least two times the surface density of aluminum in a molecular layer of said group III-V compound semiconductor epitaxial layer, said aluminum layer and said layer of the group V material constituting said group III-V compound semiconductor epitaxial layer, wherein said group III-V compound semiconductor epitaxial layer has two molecular layers, and said aluminum layer contains a quantity of aluminum at least equal to but not substantially larger than the total quantity of aluminum in two molecular layers of said group III-V compound semiconductor epitaxial layer.

17. A method of growing a group III-V compound semiconductor epitaxial layer on a substrate by use of atomic layer epitaxy as claimed in claim 16, in which said group V material is selected from a group of arsenic (As), phosphorus (P) and antimony (Sb).

18. A method of growing a group III-V compound semiconductor epitaxial layer on a substrate by use of atomic layer epitaxy as claimed in claim 16, in which said steps of growing the aluminum layer and the layer of the group V material use either one of metalorganic chemical vapor deposition and molecular beam epitaxy.

19. A method of growing a group III-V compound semiconductor epitaxial layer on a substrate by use of atomic layer epitaxy as claimed in claim 16, in which said step of growing the aluminum layer and said step of growing the layer of the group V material are alternately carried out a plurality of times.

20. A method of growing a group III-V compound semiconductor epitaxial layer on a substrate by use of atomic layer epitaxy as claimed in claim 16, in which said step of growing the aluminum layer uses one of trimethylaluminum (TMA: $(CH_3)_3Al$) and triethylaluminum (TEA: $(C_2H_5)_3Al$) as a source material.

21. A method of growing a group III-V compound semiconductor epitaxial layer on a substrate by use of atomic layer epitaxy, said method comprising the steps of:
    growing an aluminum layer on one of the {110} planes of the substrate by supplying a quantity of aluminum amounting to at least three times the surface density of aluminum in a molecular layer of said group III-V compound semiconductor epitaxial layer, whereby the obtained aluminum layer contains a quantity of aluminum essentially equal to at least the total quantity of aluminum in three molecular layers of said group III-V compound semiconductor epitaxial layer; and
    growing a layer of a group V material on the aluminum layer after said step of growing the aluminum layer by supplying a quantity of the group V material amounting to at least three times the surface density of said group V material in a molecular layer of said group III-V compound semiconductor epitaxial layer, said layer of the group V material and said aluminum layer constituting said group III-V compound semiconductor epitaxial layer, wherein said group III-V compound semiconductor epitaxial layer has three molecular layers.

22. A method of growing a group III-V compound semiconductor epitaxial layer on a substrate by use of atomic layer epitaxy as claimed in claim 21, in which said group V material is selected from a group of arsenic (As), phosphorus (P) and antimony (Sb).

23. A method of growing a group III-V compound semiconductor epitaxial layer on a substrate by use of atomic layer epitaxy as claimed in claim 21, in which said steps of growing the aluminum layer and the layer of the group V material use either one of metalorganic chemical vapor deposition and molecular beam epitaxy.

24. A method of growing a group III-V compound semiconductor epitaxial layer on a substrate by use of atomic layer epitaxy as claimed in claim 21, in which said step of growing the aluminum layer and said step of growing the layer of the group V material are alternately carried out a plurality of times.

25. A method of growing a group III-V compound semiconductor epitaxial layer on a substrate by use of atomic layer epitaxy as claimed in claim 21, in which said step of growing the aluminum layer uses one of trimethylaluminum (TMA: $(CH_3)_3Al$) and triethylaluminum (TEA: $(C_2H_5)_3Al$) as a source material.

26. A method of growing a group III-V compound semiconductor epitaxial layer on a substrate by use of atomic layer epitaxy, said method comprising the steps of:
    growing a layer of a group V material on one of the {100} planes of the substrate by supplying a quantity of the group V material amounting to at least three times the surface density of said group V material in a molecular layer of said group III-V compound semiconductor epitaxial layer; and
    growing an aluminum layer on the layer of the group V material after said step of growing the layer of the group V material by supplying a quantity of aluminum amounting to at least three times the surface density of aluminum in a molecular layer of said group III-V compound semiconductor epitaxial layer, said aluminum layer and said layer of the group V material constituting said group III-V compound semiconductor epitaxial layer, wherein said group III-V compound semiconductor epitaxial layer has three molecular layers, and said aluminum layer contains a quantity of aluminum essentially equal to at least the total quantity of aluminum in three molecular layers of said group III-V compound semiconductor epitaxial layer.

27. A method of growing a group III-V compound semiconductor epitaxial layer on a substrate by use of atomic layer epitaxy as claimed in claim 26, in which said group V material is selected from a group of arsenic (As), phosphorus (P) and antimony (Sb).

28. A method of growing a group III-V compound semiconductor epitaxial layer on a substrate by use of atomic layer epitaxy as claimed in claim 26, in which said steps of growing the aluminum layer and the layer of the group V material use either one of metalorganic chemical vapor deposition and molecular beam epitaxy.

29. A method of growing a group III-V compound semiconductor epitaxial layer on a substrate by use of atomic layer epitaxy as claimed in claim 26, in which said step of growing the aluminum layer and said step of growing the layer of the group V material are alternately carried out a plurality of times.

30. A method of growing a group III-V compound semiconductor epitaxial layer on a substrate by use of atomic layer epitaxy as claimed in claim 26, in which said step of growing the aluminum layer uses one of trimethylaluminum (TMA: $(CH_3)_3Al$) and triethylaluminum (TEA: $(C_2H_5)_3Al$) as a source material.

* * * * *

UNITED STATES PATENT AND TRADEMARK OFFICE
CERTIFICATE OF CORRECTION

PATENT NO. : 4,861,417

DATED : August 29, 1989

INVENTOR(S) : MOCHIZUKI et al

It is certified that error appears in the above-identified patent and that said Letters Patent is hereby corrected as shown below:

Column 12, line 20, "{100}" should read --{110}--.

Signed and Sealed this

Eleventh Day of September, 1990

Attest:

HARRY F. MANBECK, JR.

Attesting Officer

Commissioner of Patents and Trademarks